United States Patent [19]
Mitchell

[11] Patent Number: 5,430,443
[45] Date of Patent: Jul. 4, 1995

[54] SCANNED SWITCH MATRIX

[75] Inventor: Charles B. Mitchell, Kingston, Wash.

[73] Assignee: National Semiconductor Corporation, Santa Clara, Calif.

[21] Appl. No.: 46,023

[22] Filed: Apr. 12, 1993

[51] Int. Cl.⁶ .................. H03M 11/00; G06F 3/02
[52] U.S. Cl. .......................... 341/22; 341/26
[58] Field of Search ................ 341/22, 24, 25, 26

[56] References Cited

U.S. PATENT DOCUMENTS

| | | | |
|---|---|---|---|
| 4,633,228 | 12/1986 | Larson | 341/26 |
| 4,906,993 | 3/1990 | Freeman et al. | 341/26 |
| 5,057,836 | 10/1991 | Inaba | 341/26 |
| 5,081,453 | 1/1992 | Endoh et al. | 341/22 |
| 5,220,601 | 6/1993 | Gulick et al. | 341/26 |

OTHER PUBLICATIONS

Volker Soffel, MF2 Compatible Keyboard with COP8 Microcontrollers, Application Note 734, 1991, National Semiconductor Corporation.

*Primary Examiner*—James J. Groody
*Assistant Examiner*—Glenton B. Burgess

[57] ABSTRACT

A switch matrix circuit is described that facilitates unambiguous detection of all two key selections in a scanned matrix of switches without requiring diode based isolation of the switches, software based interpretation or timing delays. The switch matrix circuit is applicable to keypads and the like and includes a matrix of switches arranged in a plurality of electrically connected rows and columns. Each row has a driver that is capable of selectively outputting a high impedance state and an active state. Each row also has a row sense amplifier for detecting the state of its associated row. Similarly, each column has a column sense amplifier for detecting the state of its associated column.

18 Claims, 3 Drawing Sheets

SCANNED SWITCH MATRIX

BACKGROUND OF THE INVENTION

The present invention relates generally to an arrangement for detecting switch closures in a scanned matrix of switches such as those used in keyboards and keypads. More particularly, a novel switch matrix circuit is described that facilitates the unambiguous detection of all two key depressions in a scanned matrix of switches without requiring diode based isolation of the switches, interpretation through software techniques or timing delays.

In conventional keyboard implementations, a matrix of switches is provided with the switch inputs being arranged in rows and the switch outputs being arranged in columns (or vice versa). To detect the depression of a particular key, the switch inputs are actively scanned row by row in a rectangular array. During scanning, the active row is driven at a first (typically high) voltage level while the remaining rows are driven at a second (typically low) voltage level. Sense amplifiers provided for the columns are then read to determine the actual keys that have been selected. In the event that two (or more) keys within the same row are depressed simultaneously, the column based sense amplifiers are able to determine which keys have been selected. However, if a plurality of keys are depressed in the same column the selected keys cannot be determined due to shorting that occurs between the active high "scanning" row and one or more of the active low "holding" rows.

To overcome this problem, it is common to provide a diode adjacent each switch to prevent shorting through that switch as seen in FIG. 3. Although this ..solution is effective, it is relatively expensive due to the increased component count which also reduces reliability and increases the complexity of the printed circuit board layout. Another common approach is to provide software to perform the keyboard scan. The keyboard scan typically either ignores multiple key depressions or delays until all but a single key is depressed, or enters into a software algorithm which continues the keyboard scan and by a process of elimination of all of the undepressed keys determines the state of key depression. The second and third alternatives require a mechanism that detects the fact that a key depression has occurred, which is not generally the case. Yet another solution is a hybrid approach that combines the diode isolation and software scanning techniques. For example, diode isolation may be used for switches such as the Control, Shift and Alt keys and software decoding may be used for the alphanumeric keys.

SUMMARY OF THE INVENTION

Accordingly, it is an object of the present invention to provide an improved switch matrix arrangement that does not require diode isolation to permit unambiguous detection of all two key depressions when the switch matrix is scanned.

To achieve the foregoing and other objects and in accordance with the purpose of the present invention, a switch array is disclosed that includes a matrix of switches arranged in a plurality of electrically connected rows and a plurality of electrically connected columns. A first side of each switch is connected to an associated row and a second side of each switch is connected to an associated column. With this arrangement the actuation of a particular switch makes an electrical connection between that switch's associated row and column. In a preferred embodiment, the switch array takes the form of a keyboard/keypad and the switches each have a key associated therewith that can be actuated by a user to open and close the switch.

A plurality of drivers are provided with each driver being associated with a particular row. The drivers are capable of selectively outputting a high impedance state and an active state. Each row also has a row sense amplifier for detecting the state of its associated row. Similarly, each column has a column sense amplifier for detecting the state of its associated column.

In a preferred embodiment, one end of an effective resistor is connected to each column and each row. The opposite ends of the resistors are electrically connected to a source or sink at a potential that is distinguishable from the potentials outputted by the drivers in the active and high impedance states.

In another preferred embodiment, a controller is provided for selectively directing the drivers to sequentially enter the active state and decoding the sense,, amplifier outputs to determine which keys have been selected by a user.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 1:
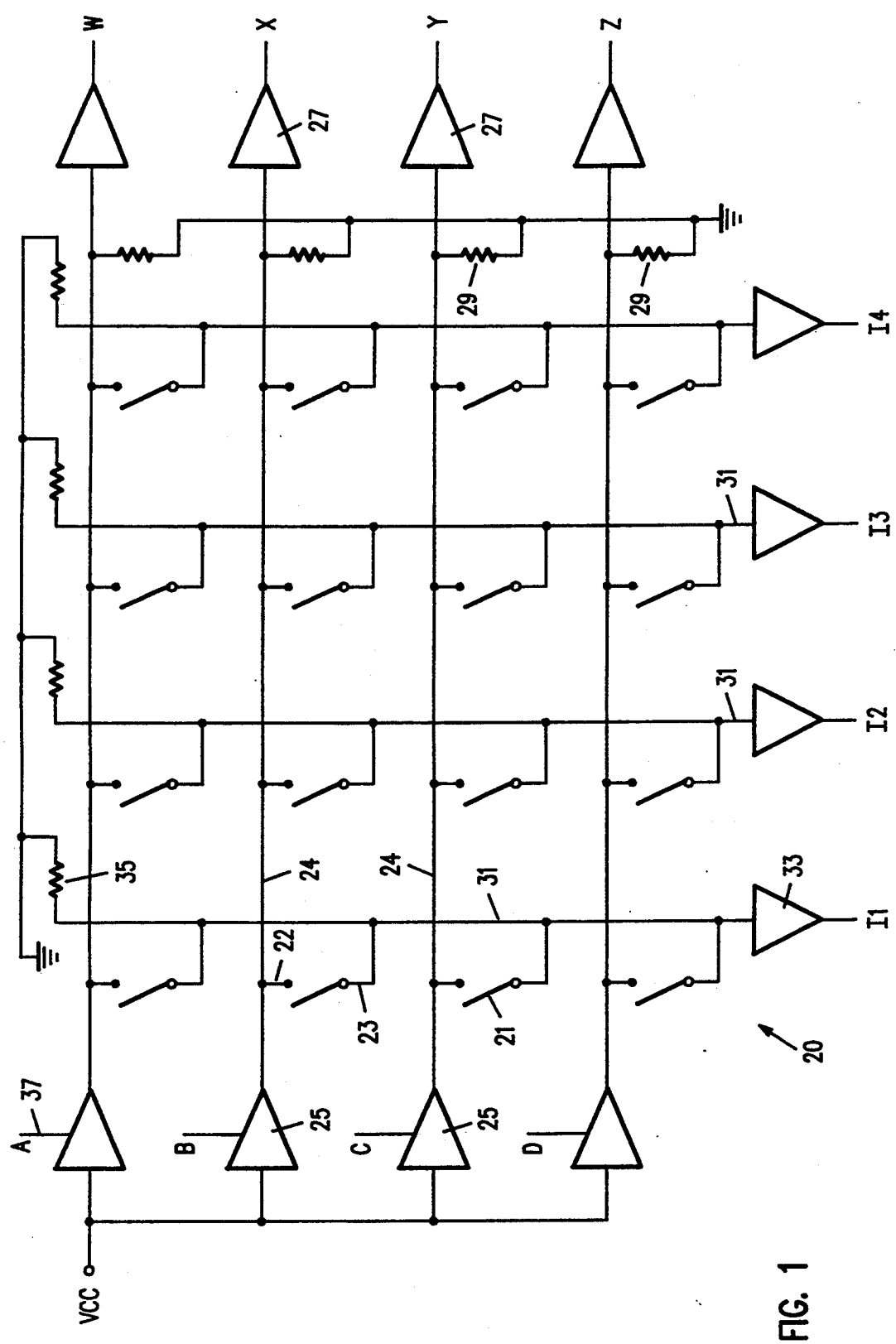
FIG. 1 is a schematic circuit diagram of a switch matrix in accordance with the present invention.

A scanning type switch matrix in accordance with the present invention is shown in FIG. 1. As seen therein, a matrix 20 of switches is formed from a multiplicity of switches 21 that are electrically connected in a plurality of rows and columns. First ends 22 of all of the switches in a particular row are coupled to a discrete row line 24. A driver 25 is provided at one side of each row line 24 and a row sense amplifier 27 is provided at the opposite side of each row line. Each row also has an associated resistor 29. Although the physical location of the resistor is not particularly important, by way of example, the resistor 29 may be connected between line 24 and a ground potential at a position between the final switch 21 in the row and the row output sense amplifier 27.

The second end 23 of each switch 21 within a particular column is coupled to a discrete column line 31. A column sense amplifier 33 is provided at for each column line. A resistor 35 is also provided for each column line. Again, while the physical location is not critical, a suitable position is on the opposite end of each column line 32 as the column sense amplifier.

The drivers 25 in the described embodiment are amplifiers that are switchable between a high impedance output state and an active current passing state. The amplifiers may all be connected to a common source $V_{cc}$ and are controlled by control lines 37. When the control line 37 associated with a particular amplifier is at a low level, the high impedance state is output. On the other hand, when the control line 37 is set to a high level, the active state is output. Of course, the activating levels of the control lines could be readily switched.

Figures 2A, 2B:
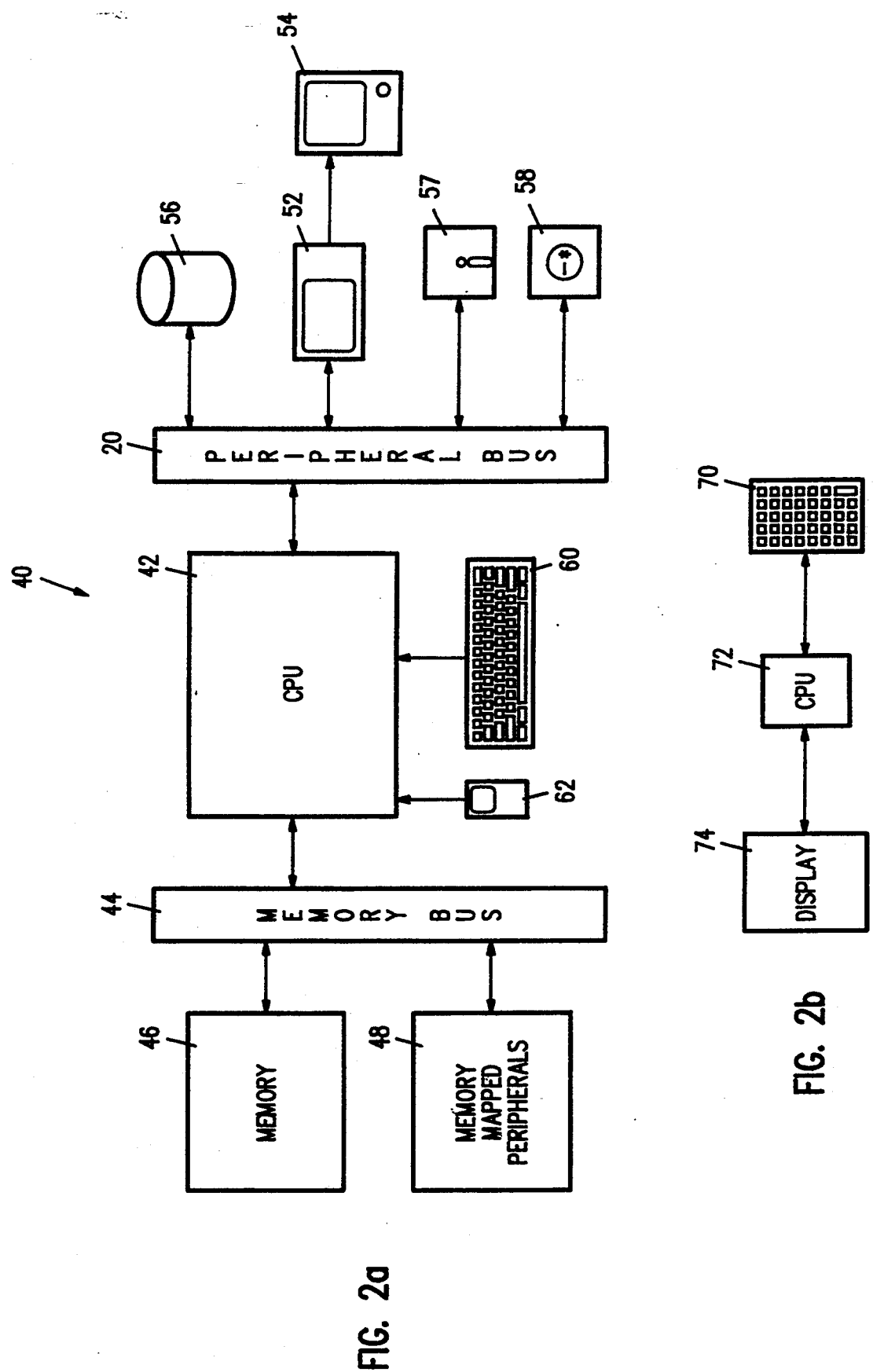
FIG. 2 is a schematic diagram of a computer system having a keyboard that incorporates the present invention.
Figure 3:
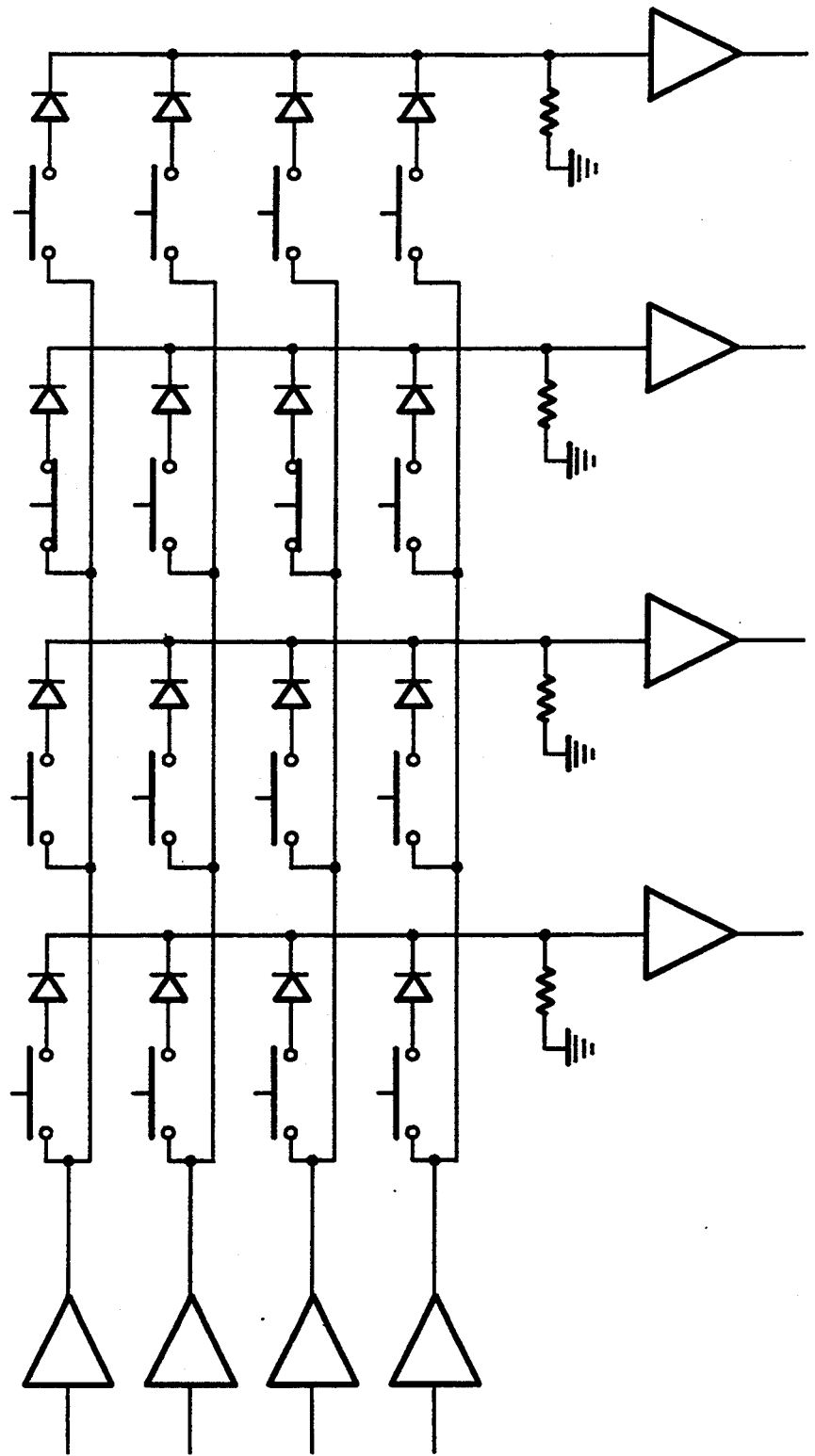
FIG. 3 is a schematic circuit diagram of a prior art switch matrix that incorporates diode isolation.

The control lines 37 are connected to a conventional scanning controller 42. By way of example, the scanning controller may take the form of a microprocessor that controls the operation of a device or system that incorporates the switch matrix. The most common application of scanned switch matrixes are in keyboard and keypad style input devices such the keyboards commonly used in computer systems as shown in FIG. 2a, and keypads as shown in FIG. 2b. used in calculators, appliances and a wide variety of other devices and instruments. As used herein and in the claims, the terms keyboard and keypad are intended to be interchangeable and to broadly encompass any key based input devices.

In operation, the amplifiers 25 are normally kept in the high impedance state. During scanning, control lines 37 are sequentially transitioned from the low state to the high state by the scanning controller 40. Accordingly their respective amplifiers are sequentially transitioned from high impedance state to the active state. Simultaneously, the row and column sense amplifiers are interrogated by the controller 40. The controller decodes the sense amplifier outputs in order to determine which keys have been selected. If no keys are selected in the currently active row, then none of the column sense amplifiers will be activated and only the active row's sense amplifier will be activated.

For normal single key operations, the selected key's associated row and column output amplifiers alone will both be activated when the selected key's row is active. If multiple keys in a single active row are selected simultaneously, then each of the corresponding column output sense amplifiers will be activated in addition to the row output sense amplifier. If multiple keys in a single active column are selected simultaneously, then each of the corresponding row output sense amplifiers will be activated in addition to the column output sense amplifier for the column in which the selected keys are found.

With this arrangement, any two key depression in the scanned switch matrix can be unambiguously detected. If the two depressed keys are in the same row or the same column, they will be detected simultaneously as discussed above. If the two depressed keys are in entirely different rows and columns, then they will be individually detected when their corresponding rows are transitioned to the active state.

A wide variety of three and four key depressions can also be unambiguously detected, using the described arrangement. However, not all combinations of three or more key depressions can be accurately discerned. Specifically, combinations that include a plurality of keys in the same row and a plurality of keys in the same column wherein one key is in each set, cannot be unambiguously detected.

The resistance of resistors 29 and 35 is selected to be greater in value than the active state potential divided by the active driver current but lower than the inactive state potential divided by the sum of the leakage currents associated with the sense amplifier and the driver tristate outputs. Preferably the resistance of each of the resistors 29 and 35 is substantially the same, although this is not an absolute requirement. By way of example, in a keyboard arrangement where the active state potential ($V_{cc}$) is five volts, and CMOS technology is in use a suitable resistance setting is 100 K ohms.

Referring next to FIG. 2a, a computer system 40 that includes a keyboard 60 suitable for use with the present invention will be briefly described. The computer system 40 includes a central processing unit (CPU) 42, a bidirectional memory bus 44 which couples the CPU to memory 46 and memory mapped peripherals 48, and a bidirectional peripheral bus 50 which connects the CPU to a variety of peripheral devices. The memory 44 typically takes the form of both read only memory (ROM) and random access memory (RAM). Memory mapped peripherals typically include video adapters and data storage devices. A variety of peripheral devices can be coupled to the peripheral bus 50. By way of example, peripherals devices that are frequently connected to the peripheral bus include a video card 52 which controls a display monitor 54, a Winchester type hard disc drive 56, a floppy disc drive 57 and/or CD ROM 58. The keyboard 60 and a pointer device 62 such as a mouse or track ball are typically connected directly to the CPU 42. Both the keyboard and the pointer device are arranged to function as user input devices. As will be appreciated by those skilled in the art, a wide variety of other peripheral devices can be connected to either the peripheral bus or the memory bus and the buses which connect the described peripherals to the CPU can be switched and/or additional buses can be added.

In the embodiment shown in FIG. 2b, an input keypad 70 that is suitable for use with the present invention is disclosed. The keypad may be used in calculators, appliances and a wide variety of other devices and instruments. The input keypad 70 is coupled to a CPU 72 which in turn is connected to a display 74.

Although the embodiment of the invention illustrated in FIG. 1 is a simple rectangular four by four switch matrix to facilitate clarity, it should be appreciated that the invention is equally applicable to any sized switch matrix and regardless of whether the matrix is a rectangular matrix. The application described in the example is a keyboard/keypad switch matrix embodiment. The keypads may be used as input devices for a wide variety devices and systems. By way of example, they can be used in computer or electronic typewriter keyboards as well as input keypads for calculators, appliances, machinery, instruments and a wide variety of other devices. However, the invention is not limited to keyboard/keypad applications. Rather it can be used in any scanned switch matrix. The actual type of switch to be interrogated can also be widely varied. By way of example, in addition to keypad type mechanical switches, the switch mechanism may be formed from any suitable electrical switching mechanism including semiconductor, capacitive, bimetallic, relay or other switching elements.

In the described embodiment, the resistors are coupled to a ground potential. Of course, the invention can be adapted to work with any sink (or source) potential, so long as there is a suitable difference between the source and sink potentials. Therefore, the present examples are to be considered as illustrative and not restrictive, and the invention is not to be limited to the details given herein, but may be modified within the scope of the appended claims.

I claim:

1. A switch array comprising:
a matrix of switches arranged in a plurality of electrically connected rows and a plurality of electrically connected columns, wherein a first side of each switch is connected to an associated row and a second side of each switch is connected to an associated column such that actuation of a particular switch makes an electrical connection between that switch's associated row and column;

a plurality of drivers for selectively outputting signals corresponding to a high impedance state and an active state, each driver being associated with a particular row of said switch matrix;

a plurality of column sense amplifiers, each column sense amplifier being associated with a particular column of said switch matrix for detecting the state of its associated column; and a plurality of row sense amplifiers, each row sense amplifier being associated with a particular row of said switch matrix for detecting the state of its associated row;

whereby in the event of a substantially simultaneous actuation of any pair of the switches, an accurate unambiguous detection may be made of both of the switches undergoing the substantially simultaneous actuation.

2. A switch array as recited in claim 1 wherein the switch matrix is a part of a keyboard having a multiplicity of keys, each key being associated with an associated one of said switches and arranged such that when a user selects a particular key the selected key's associated switch is closed.

3. A switch array as recited in claim 1 further comprising a plurality of resistors, each resistor being coupled to a potential that is distinguishable from the potentials outputted by the drivers in the active and high impedance states, each column having a discrete resistor associated therewith and each row having a discrete resistor associated therewith.

4. A switch array as recited in claim 3 wherein the resistors have a resistance that is greater than the potential outputted by the drivers in the active state divided by the driver current.

5. A switch array as recited in claim 4 wherein the resistors halve a resistance that is less than the potential outputted by the drivers in the high impedance state divided by the sum of the leakage currents associated with the sense amplifier and the driver.

6. A switch array as recited in claim 1 wherein each driver includes an amplifier.

7. A switch array as recited in claim 1 further comprising control means for selectively directing the drivers to sequentially enter the active state and decoding the sense amplifier outputs to determine which keys have been selected by a user.

8. A switch array as recited in claim 7 wherein the control means includes a microprocessor.

9. A key based input device comprising:

a keypad including a multiplicity of keys that are electrically coupled in a plurality of rows and a plurality of columns, each key having an electrical switch associated therewith, wherein a first side of each switch is connected to an associated row and a second side of each switch is connected to an associated column such that actuation of a particular key makes an electrical connection between that key's associated row and column;

a plurality of drivers for selectively outputting signals corresponding to a high impedance state and an active state, each driver being associated with a particular row of said keypad;

a plurality of row sense amplifiers, each row sense amplifier being associated with a particular row of said keypad for detecting the state of its associated row; and a plurality of column sense amplifiers, each column sense amplifier being associated with a particular column of said keypad for detecting the state of its associated column; whereby in the event of a substantially simultaneous actuation of a pair of the switches caused by a substantially simultaneous depression of any pair of keys, an accurate unambiguous detection may be made of both of the switches undergoing the substantially simultaneous actuation.

10. A key based input device as recited in claim 9 wherein key in the keypad are physically arranged into a plurality of rows and columns that correspond to the electrically connected rows and columns.

11. A key based input device as recited in claim 9 wherein the keys in the keypad are not physically arranged into rows and columns that correspond exactly to the electrically connected rows and columns.

12. A key based input device as recited in claim 9 further comprising a plurality of resistors, each resistor being coupled to a potential that is distinguishable from the potentials outputted by the drivers in the active and high impedance states, each column having a discrete resistor associated therewith and each row having a discrete resistor associated therewith.

13. A key based input device as recited in claim 12 wherein the resistors have a resistance that is greater than the potential outputted by the drivers in the active state divided by the driver current.

14. A key based input device as recited in claim 13 wherein the resistors have a resistance that is less than the potential outputted by the drivers in the high impedance state divided by the input leakage voltage of its associated sense amplifier.

15. A key based input device as recited in claim 9 further comprising control means for selectively directing the drivers to sequentially enter the active :state and decoding the sense amplifier outputs to determine which keys have been selected by a user.

16. A key based input device as recited in claim 15 wherein the ,control means includes a microprocessor.

17. A key based input device as recited in claim 16 wherein the keypad is used in a computer system.

18. A key based input device as recited in claim 9 wherein the keypad takes the form of an appliance keypad.

* * * * *

UNITED STATES PATENT AND TRADEMARK OFFICE
CERTIFICATE OF CORRECTION

PATENT NO. : 5,430,443
DATED : July 4, 1995
INVENTOR(S) : Mitchell

It is certified that error appears in the above-indentified patent and that said Letters Patent is hereby corrected as shown below:

```
Column 1, line 34, before "solution" delete the ".."
Column 2, line 22, after "sense" delete the ",,"
Column 4, line 5, before "computer" delete the "."
Column 5, line 42, change "halve" to --have--
Column 6, line 50, before "state" delete the ":"
Column 6, line 54, before "control" delete the ","
```

Signed and Sealed this

Twenty-seventh Day of February, 1996

Attest:

BRUCE LEHMAN

*Attesting Officer*      Commissioner of Patents and Trademarks